(12) United States Patent
Chen et al.

(10) Patent No.: US 11,417,588 B2
(45) Date of Patent: Aug. 16, 2022

(54) SEMICONDUCTOR STRUCTURE AND LAYOUT METHOD OF A SEMICONDUCTOR STRUCTURE

(71) Applicant: TAIWAN SEMICONDUCTOR MANUFACTURING COMPANY LTD., Hsinchu (TW)

(72) Inventors: Wei-Ren Chen, Hsinchu (TW); Chih-Liang Chen, Hsinchu (TW); Wei-Ling Chang, Hsinchu (TW); Hui-Zhong Zhuang, Kaohsiung (TW); Li-Chun Tien, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 67 days.

(21) Appl. No.: 16/943,806

(22) Filed: Jul. 30, 2020

(65) Prior Publication Data
US 2022/0037233 A1    Feb. 3, 2022

(51) Int. Cl.
*H01L 23/48* (2006.01)
*H01L 21/48* (2006.01)
*H01L 27/02* (2006.01)

(52) U.S. Cl.
CPC ........ *H01L 23/481* (2013.01); *H01L 21/4814* (2013.01); *H01L 27/0207* (2013.01)

(58) Field of Classification Search
CPC .............. H01L 21/4814; H01L 23/481; H01L 27/0207
See application file for complete search history.

(56) References Cited

U.S. PATENT DOCUMENTS

| 2005/0280031 | A1* | 12/2005 | Yano | H01L 27/0207 257/202 |
| 2020/0082052 | A1* | 3/2020 | Chien | G06F 30/394 |
| 2020/0098631 | A1* | 3/2020 | Lin | G06F 30/394 |

* cited by examiner

*Primary Examiner* — Herve-Louis Y Assouman
(74) *Attorney, Agent, or Firm* — WPAT, P.C., Intellectual Property Attorneys; Anthony King

(57) ABSTRACT

A semiconductor structure includes a plurality of vias and a metal layer. The vias disposed on a semiconductor substrate. The metal layer has a plurality of metal lines and at least one transmission gate line region. The metal lines are connected to the vias. The at least one transmission gate line region is connected to at least one transmission gate corresponding to at least one transmission gate circuit. The transmission gate line region includes at least one different-net via pair. The different-net via pair has two metal lines and each of the two metal lines is connected to a via respectively. The two metal lines extend along a first axis but toward opposite directions. A distance between the two vias of the different-net via pair is within about 1.5 poly pitch.

20 Claims, 17 Drawing Sheets

SEMICONDUCTOR STRUCTURE AND LAYOUT METHOD OF A SEMICONDUCTOR STRUCTURE

BACKGROUND

The semiconductor integrated circuit (IC) industry has experienced exponential growth. Technological advances in IC materials and design have produced generations of ICs, where each generation has smaller and more complex circuits than the previous generation. In the course of IC evolution, functional density (e.g., the number of interconnected devices per chip area) has generally increased while geometry size (e.g., the smallest component or line that can be created using a fabrication process) has decreased. However, the space between two ends of two metal lines is still large to cause cell area larger.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
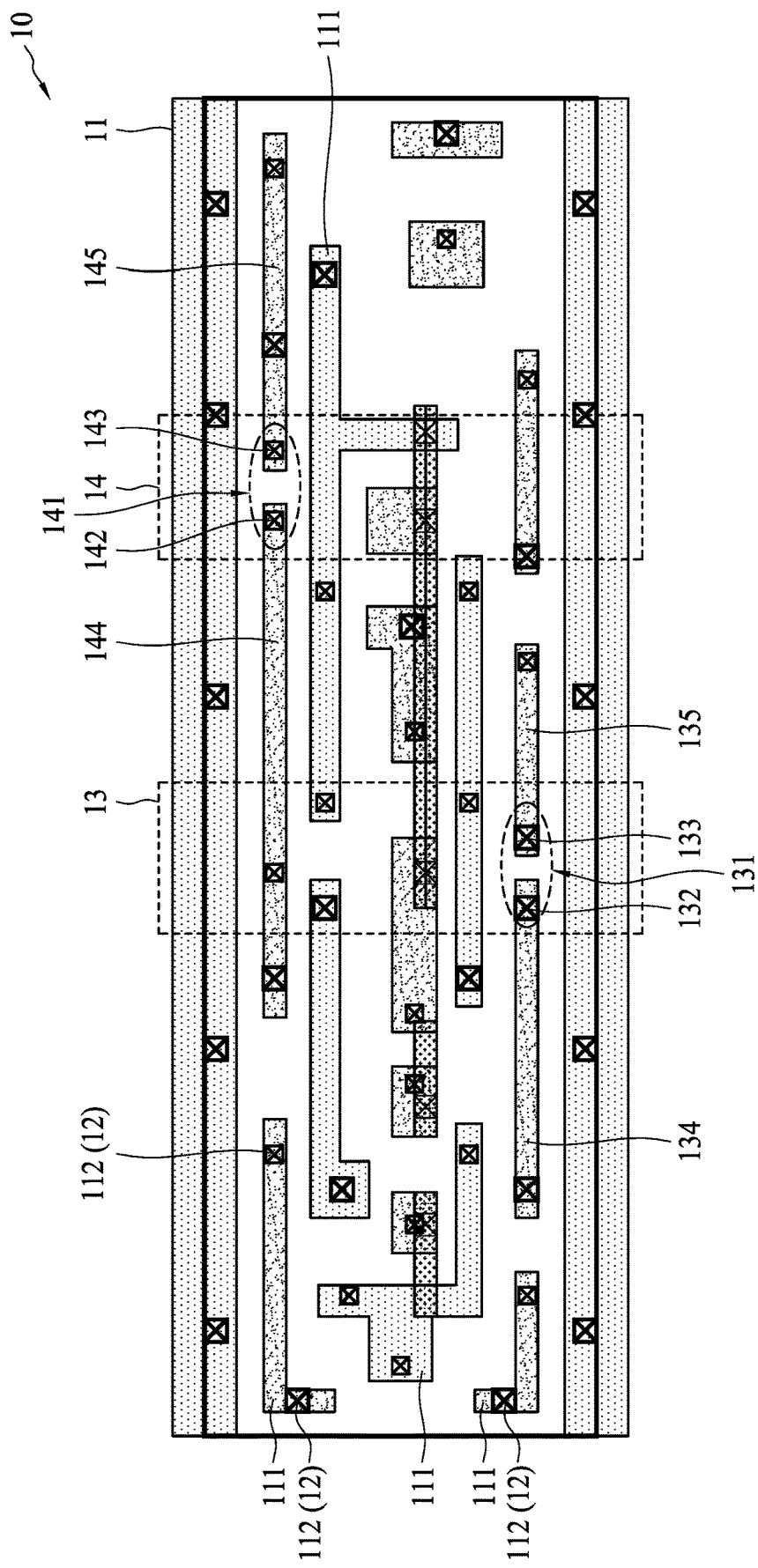
FIG. 1 illustrates a layout view of a semiconductor structure in accordance with some embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Referring to the figures, wherein like numerals indicate like parts throughout the several views. FIG. 1 illustrates a layout view of a semiconductor structure in accordance with some embodiments of the present disclosure. Referring to FIG. 1, a semiconductor structure 10 may include a metal layer 11 and a plurality of vias 12. The vias are disposed on a semiconductor substrate. The metal layer 11 has a plurality of metal lines 111, a plurality of contacts 112 and at least one transmission gate line region 13, 14. The metal lines 111 are connected to the vias 12, and the vias 12 and the metal lines 111 meet at the contacts 112. In accordance with some embodiments of the present disclosure, the vias 12 may be disposed under the contacts 112.

The at least one transmission gate line region 13, 14 are connected to at least one transmission gate corresponding to at least one transmission gate circuit. The transmission gate circuit may be an analog gate similar to a relay that can conduct in both directions or block by a control signal with almost any voltage potential. The transmission gate circuit may include two transistors having two control terminals respectively. The transmission gate line region 13 includes at least one different-net via pair 131. The different-net via pair 131 has two vias 132, 133 and two metal lines 134, 135. The different-net via pair 131 is corresponding to the two control terminals of the transmission gate circuit. In accordance with some embodiments of the present disclosure, each of the two vias 132, 133 is connected to a control terminal respectively. The two metal lines 134, 135 are respectively connected to different net and each of the two metal lines 134, 135 is connected to a via respectively. For example, the metal line 134 is connected to the via 132, and the metal line 135 is connected to the via 133. Thus, the metal line 134 may be a first control metal line for the transmission gate circuit, and the metal line 135 may be a second control metal line for the transmission gate circuit. In accordance with some embodiments of the present disclosure, the metal line 134 may be connected to a first control net, and the metal line 135 may be connected to a second control net. The first control net is different from the second control net. For example, the first control net may be any control net, but it is different from the second control net. The second control net may be any control net, but it is different from the first control net.

The two metal lines 134, 135 extend along a first axis but toward opposite directions, for example, the first axis is X-axis. In accordance with some embodiments of the present disclosure, the metal line 134 is extended toward the left-hand direction, and the metal line 135 is extended toward the right-hand direction. A distance between the two vias 132, 133 of the different-net via pair 131 is within about 1.5 poly pitch. The distance may be between about 0.8-1.5 poly pitch.

Therefore, by using the different-net via pair 131, the space between two metal lines 134, 135 can be reduced so as to reduce the cell area. Furthermore, the metal line density of the metal layer can be improved, and the total ploy pitch of the metal layer can be shortened.

In accordance with some embodiments of the present disclosure, the transmission gate line region 14 includes at least one different-net via pair 141, and the different-net via pair 141 has two vias 142, 143 and two metal lines 144, 145. The two metal lines 144, 145 are respectively connected to different net and each of the two metal lines 144, 145 is connected to a via respectively. For example, the metal line 144 is connected to the via 142, and the metal line 145 is connected to the via 143. The two metal lines 144, 145 extend along the first axis (X-axis) but toward opposite directions. In accordance with some embodiments of the present disclosure, the metal line 144 is extended toward the left-hand direction, and the metal line 145 is extended toward the right-hand direction. A distance between the two vias 142, 143 of the different-net via pair 141 is within about 1.5 poly pitch. The distance may be between about 0.8-1.5 poly pitch.

Figure 2:
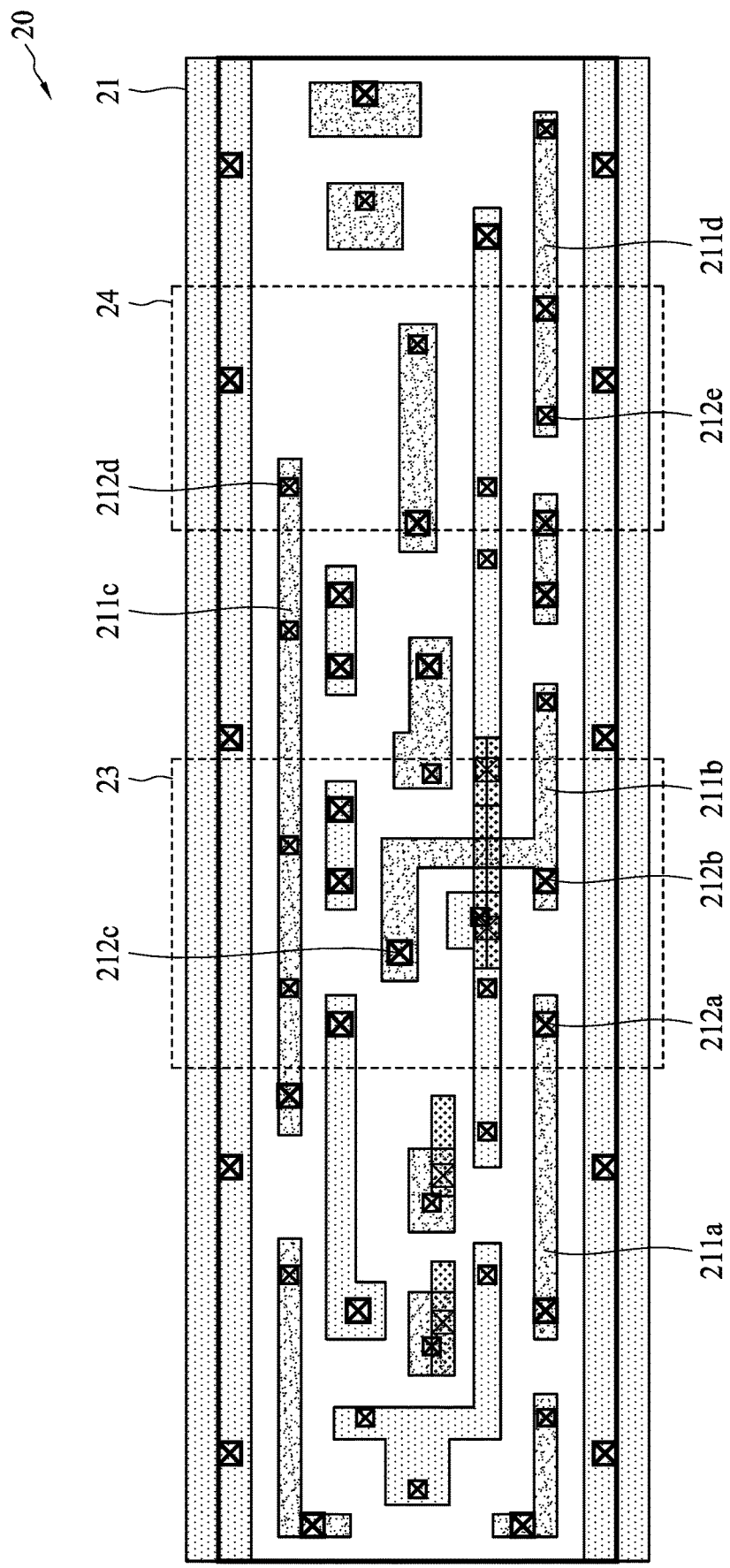
FIG. 2 illustrates a layout view of a semiconductor structure in accordance with an unadjusted layout without the different-net via pair.

FIG. 2 illustrates a layout view of a semiconductor structure in accordance with an unadjusted layout without the different-net via pair. Referring to FIG. 1 and FIG. 2, in accordance with some embodiments of the present disclosure, the layout of the metal layer 11 can be derived from an unadjusted layout of an unadjusted metal layer 21. A semiconductor structure 20 includes a plurality of vias 212a, 212b, 212c, 212d, 212e and the unadjusted metal layer 21. The unadjusted metal layer 21 has a plurality of metal lines 211a, 211b, 211c, 211d. The vias 212a, 212b, 212c, 212d, 212e are disposed on a semiconductor substrate. The via 212a is electrically connected to the metal line 211a. The vias 212b, 212c are electrically connected to the metal line 211b. The metal line 211b is extended in two axes, for example, the X-axis and the Y-axis. The via 212d is electrically connected to the metal line 211c. The via 212e is electrically connected to the metal line 211d.

The at least one transmission gate line region 23, 24 are a portion of the metal layer 21 and connected to at least one transmission gate corresponding to at least one transmission gate circuit. However, the transmission gate line regions 23, 24 do not have the different-net via pair 131, 141 as shown in FIG. 1. For the unadjusted metal layer 21, the space between two ends of two metal lines is too large so that the size of the unadjusted metal layer 21 cannot be reduced.

In the transmission gate line region 23, the vias 212b, 212c are electrically connected to the metal line 211b. Thus, the via 212c may be moved adjacent to the via 212a to be the via 133 as shown in FIG. 1, and the metal line 211b may be adjusted to extend in the first axis (X-axis), and the other portion of the metal line 211b may be cut to be the metal line 135 as shown in FIG. 1. Furthermore, the via 212a in FIG. 2 may be the via 132 in FIG. 1, and the metal line 211a in FIG. 2 may be the metal line 134 in FIG. 1. Therefore, the transmission gate line region 23 may be adjusted to be the transmission gate line region 13 having the different-net via pair 131.

In the transmission gate line region 24, the metal line 211d may be moved adjacent to the metal line 211c to be the metal line 145 as shown in FIG. 1, and the via 212e may be the via 143 as shown in FIG. 1. Furthermore, the via 212d in FIG. 2 may be the via 142 in FIG. 1, and the metal line 211c in FIG. 2 may be the metal line 144 in FIG. 1. Therefore, the transmission gate line region 24 may be adjusted to be the transmission gate line region 14 having the different-net via pair 141.

Figure 3:
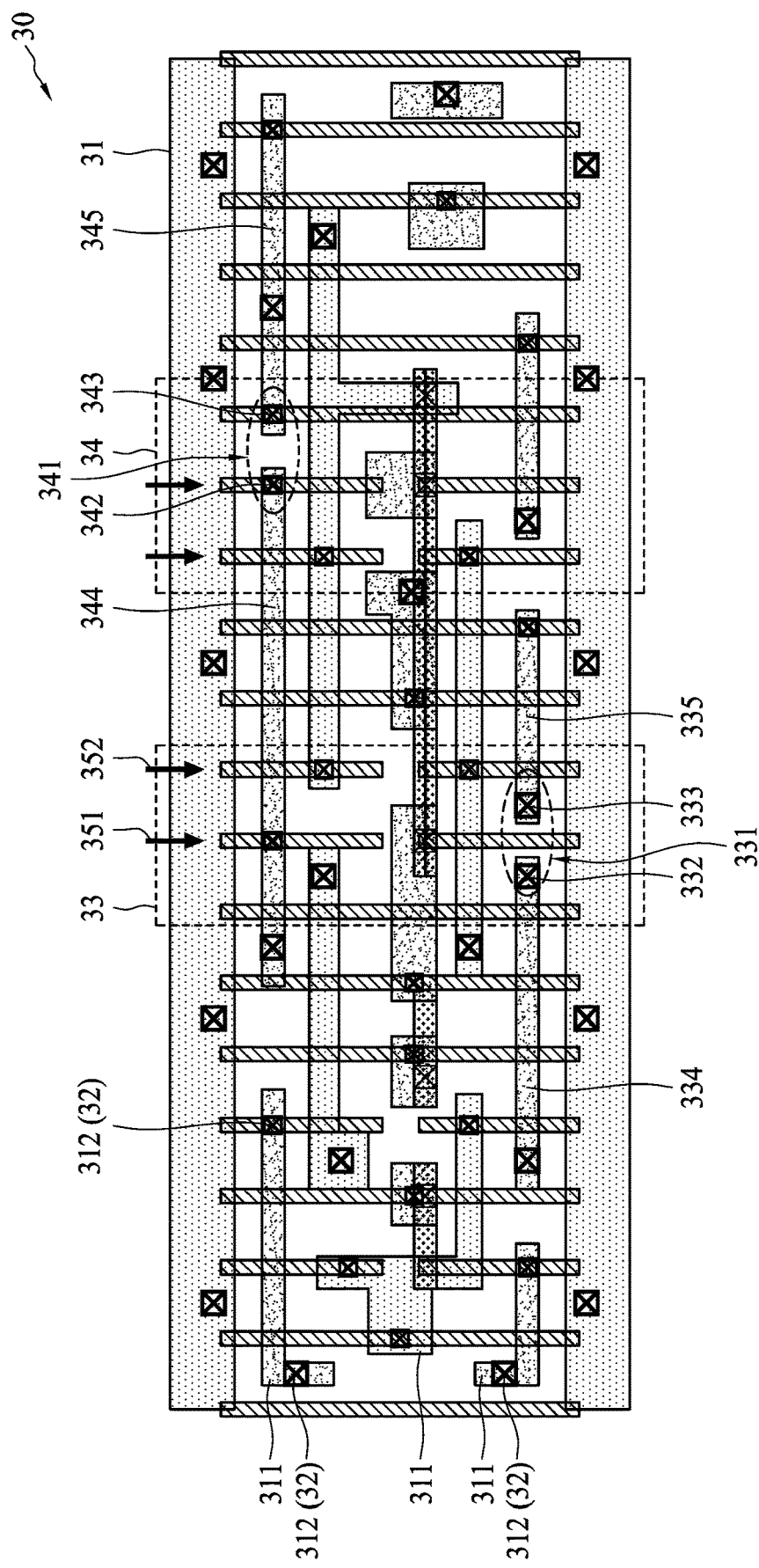
FIG. 3 illustrates a layout view of a semiconductor structure in accordance with some embodiments of the present disclosure.

FIG. 3 illustrates a layout view of a semiconductor structure in accordance with some embodiments of the present disclosure. Referring to FIG. 3, a semiconductor structure 30 may include a metal layer 31 and a plurality of vias 32. The vias 32 are disposed on a semiconductor substrate. The metal layer 31 has a plurality of metal lines 311, a plurality of contacts 312 and at least one disconnected poly line region 33, 34. The metal lines 311 are connected to the vias 32, and the vias 32 and the metal lines 311 meet at the contacts 312. In accordance with some embodiments of the present disclosure, the vias 32 may be disposed under the contacts 312.

The at least one disconnected poly line region 33, 34 are a portion of the metal layer 31 and corresponding to at least one disconnected poly strap 351, 352. In accordance with some embodiments of the present disclosure, the disconnected poly straps 351 and 352 may be disposed on the different layer with the metal layer 31, for example the disconnected poly straps 351, 352 may be disposed under the metal layer 31. The disconnected poly line region 33 includes at least one different-net via pair 331, and the different-net via pair 331 has two vias 332, 333 and two metal lines 334, 335. The two metal lines 334, 335 are respectively connected to different net and each of the two metal lines 334, 335 connected to a via respectively. For example, the metal line 334 is connected to the via 332, and the metal line 335 is connected to the via 333. The two metal lines 334, 335 extend along the first axis (X-axis) but toward opposite directions. In accordance with some embodiments of the present disclosure, the metal line 334 is extended toward the left-hand direction, and the metal line 335 is extended toward the right-hand direction. A distance between the two vias 332, 333 of the different-net via pair is within about 1.5 poly pitch. The distance may be between about 0.8-1.5 poly pitch.

Therefore, by using the different-net via pair 331, the space between two metal lines 334, 335 can be reduced so as to reduce the cell area. Furthermore, the metal line density of the metal layer can be improved, and the total ploy pitch of the metal layer can be shortened.

In accordance with some embodiments of the present disclosure, the disconnected poly line region 34 includes at least one different-net via pair 341, and the different-net via pair 341 has two vias 342, 343 and two metal lines 344, 345. The two metal lines 344, 345 are respectively connected to different net and each of the two metal lines 344, 345 connected to a via respectively. For example, the metal line 344 is connected to the via 342, and the metal line 345 is connected to the via 343. The two metal lines 344, 345 extend along the first axis (X-axis) but toward opposite directions. In accordance with some embodiments of the present disclosure, the metal line 344 is extended toward the left-hand direction, and the metal line 345 is extended toward the right-hand direction. A distance between the two vias 342, 343 of the different-net via pair 341 is within about 1.5 poly pitch. The distance may be between about 0.8-1.5 poly pitch.

Figure 4:
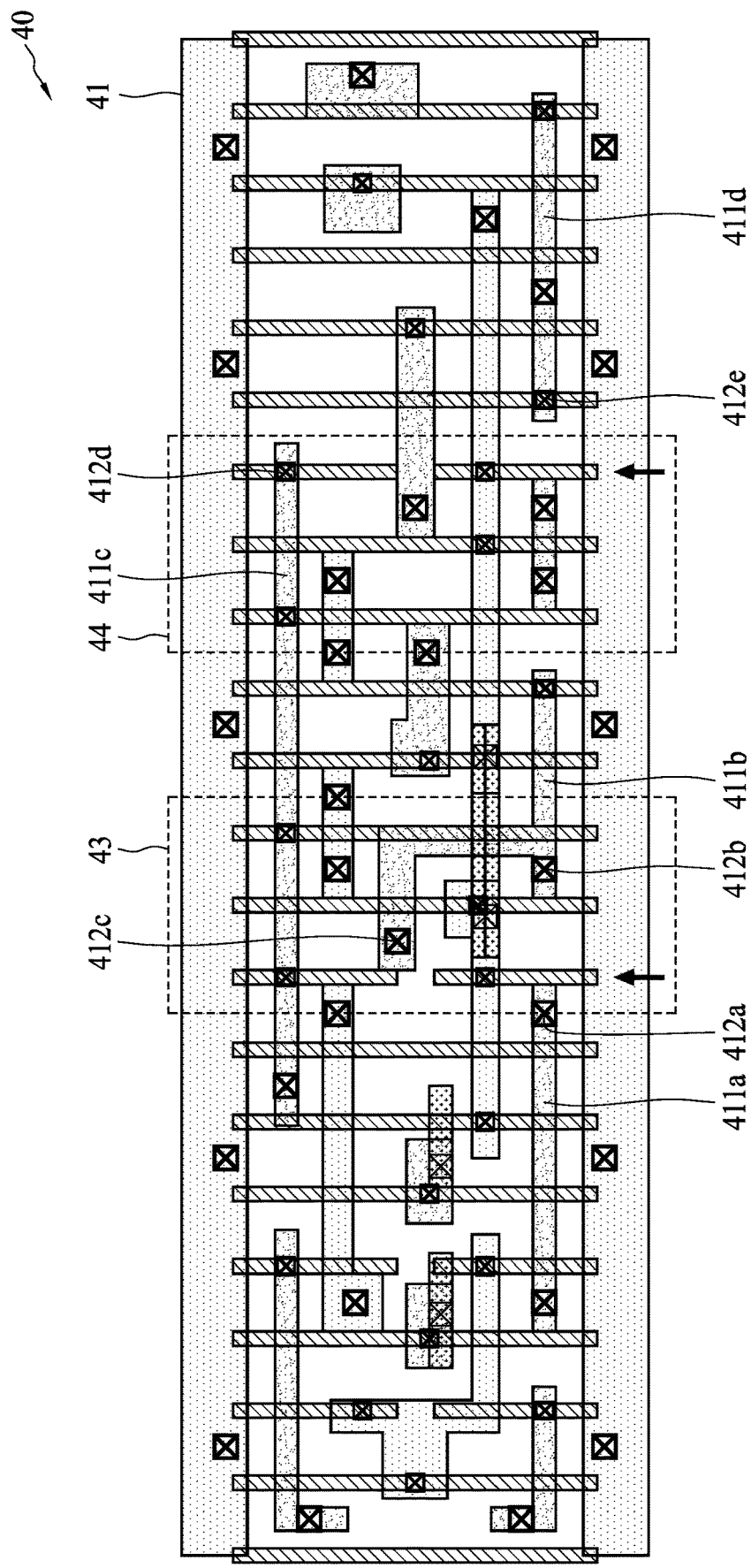
FIG. 4 illustrates a layout view of a semiconductor structure in accordance with an unadjusted layout without the different-net via pair.

FIG. 4 illustrates a layout view of a semiconductor structure in accordance with an unadjusted layout without the different-net via pair. Referring to FIG. 3 and FIG. 4, in accordance with some embodiments of the present disclosure, the layout of the metal layer 31 may be derived from an unadjusted layout of an unadjusted metal layer 41. A semiconductor structure 40 includes a plurality of vias 412a, 412b, 412c, 412d, 412e and the unadjusted metal layer 41. The unadjusted metal layer 41 has a plurality of metal lines 411a, 411b, 411c, 411d. The vias 412a, 412b, 412c, 412d, 412e are disposed on a semiconductor substrate. The via 412a is electrically connected to the metal line 411a. The vias 412b, 412c are electrically connected to the metal line 411b. The metal line 411b is extended in two directions, for example, the X-axis and the Y-axis. The via 412d is electrically connected to the metal line 411c. The via 412e is electrically connected to the metal line 411d.

The at least one disconnected poly line regions 43, 44 are a portion of the metal layer 41 and corresponding to at least one disconnected poly strap. However, the disconnected poly line regions 43, 44 do not have the different-net via pair 331, 341 as shown in FIG. 3. For the unadjusted metal layer 41, the space between two ends of two metal lines is too large so that the size of the unadjusted metal layer 41 cannot be reduced.

In the transmission gate line region 43, the vias 412b, 412c are electrically connected to the metal line 411b. Thus, the via 412c may be moved adjacent to the via 412a to be the via 333 as shown in FIG. 3, and the metal line 411b may be adjusted to extend in the first direction, and the other portion of the metal line 411b may be cut to be the metal line 335 as shown in FIG. 3. Furthermore, the via 412a in FIG. 4 may be the via 332 in FIG. 3, and the metal line 411a in FIG. 4 may be the metal line 334 in FIG. 3. Therefore, the transmission gate line region 43 may be adjusted to be the transmission gate line region 33 having the different-net via pair 331.

In the transmission gate line region 44, the metal line 411d may be moved adjacent to the metal line 411c to be the metal line 345 as shown in FIG. 3, and the via 412d may be the via 343 as shown in FIG. 3. Furthermore, the via 412d in FIG. 4 may be the via 342 in FIG. 3, and the metal line 411c in FIG. 4 may be the metal line 344 in FIG. 3. Therefore, the transmission gate line region 44 may be adjusted to be the transmission gate line region 34 having the different-net via pair 341.

In accordance with some embodiments of the present disclosure, the length of the metal layer 41 is twenty-one ploy pitches, and the length of the metal layer 31 is nineteen ploy pitches. Therefore, the size of the metal layer 31 can be shortened, and the cell density in the metal layer 31 can be improved.

Figures 5A, 5B:
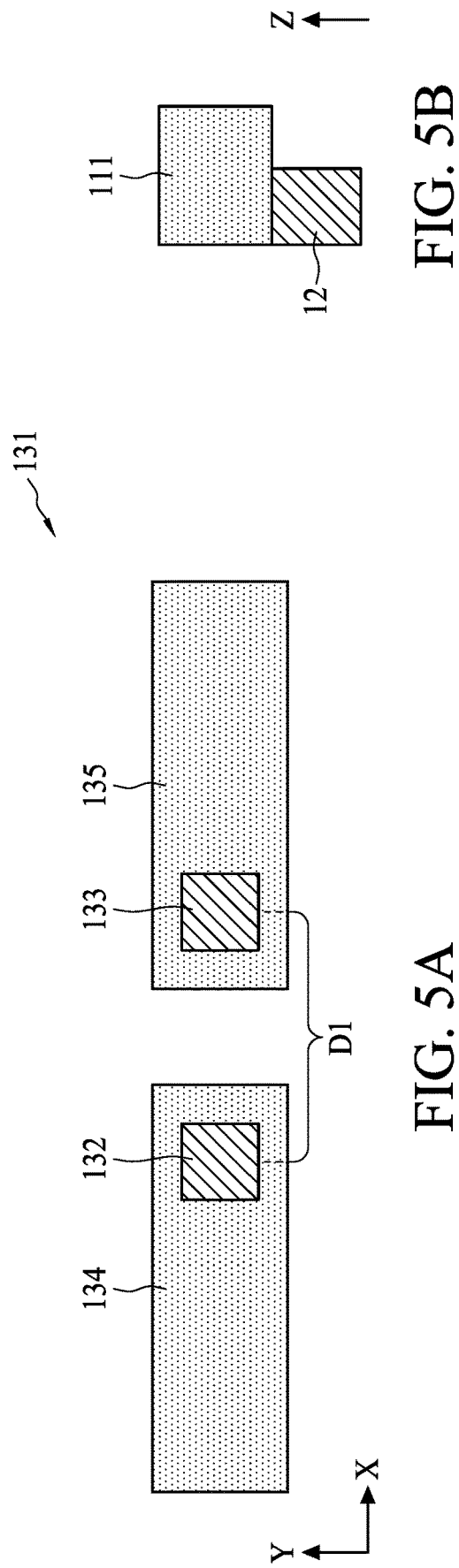
FIG. 5A illustrates a schematic view of a different-net via pair in accordance with some embodiments of the present disclosure.
FIG. 5B illustrates a schematic view of a metal line and a via in accordance with some embodiments of the present disclosure.

FIG. 5A illustrates a schematic view of a different-net via pair in accordance with some embodiments of the present disclosure. Referring to FIG. 1 and FIG. 5A, the different-net via pair 131 has two vias 132, 133 and two metal lines 134, 135. The two metal lines 134, 135 are respectively connected to different net and extending in the first axis (X-axis). A distance D1 between the two vias 132, 133 of the different-net via pair 131 is within about 1.5 poly pitch. In accordance with some embodiments of the present disclosure, the distance may be between about 0.8-1.5 poly pitch, thus the distance D1 is equal to about 0.8-1.5 multiplied by the poly pitch. In accordance with some embodiments of the present disclosure, the poly pitch may be a minimum value for the poly pitch in the wafer. In accordance with some embodiments of the present disclosure, the distance D1 may be a distance from a center of the via 132 to a center of the via 133. In accordance with some embodiments of the present disclosure, the shape of the vias 132, 133 may be square, rectangle or circle.

Similarly, for the different-net via pair 141, the different-net via pair 141 has two vias 142, 143 and two metal lines 144, 145. The two metal lines 144, 145 are respectively connected to different net and extending in the first axis (X-axis). A distance D1 between the two vias 142, 143 of the different-net via pair 141 is within about 1.5 poly pitch. In accordance with some embodiments of the present disclosure, the distance may be between about 0.8-1.5 poly pitch, thus the distance D1 is equal to about 0.8-1.5 multiplied by the poly pitch. In accordance with some embodiments of the present disclosure, the distance D1 may be a distance from a center of the via 142 to a center of the via 143. In accordance with some embodiments of the present disclosure, the shape of the vias 142, 143 may be square, rectangle or circle.

Referring to FIG. 3 and FIG. 5A, similarly, for the different-net via pair 331, the different-net via pair 331 has two vias 332, 333 and two metal lines 334, 335. The two metal lines 334, 335 are respectively connected to different net and extending in the first axis (X-axis). A distance D1 between the two vias 332, 333 of the different-net via pair 331 is within about 1.5 poly pitch. In accordance with some embodiments of the present disclosure, the distance may be between about 0.8-1.5 poly pitch, thus the distance D1 is equal to about 0.8-1.5 multiplied by the poly pitch. In accordance with some embodiments of the present disclosure, the poly pitch may be a minimum value between two poly straps in the wafer. In accordance with some embodiments of the present disclosure, the distance D1 may be a distance from a center of the via 332 to a center of the via 333. In accordance with some embodiments of the present disclosure, the shape of the vias 332, 333 may be square, rectangle or circle.

Similarly, for the different-net via pair 341, the different-net via pair 341 has two vias 342, 343 and two metal lines 344, 345. The two metal lines 344, 345 are respectively connected to different net and extending in the first axis (X-axis). A distance D1 between the two vias 342, 343 of the different-net via pair 341 is within about 1.5 poly pitch. In accordance with some embodiments of the present disclosure, the distance may be between about 0.8-1.5 poly pitch, thus the distance D1 is equal to about 0.8-1.5 multiplied by the poly pitch. In accordance with some embodiments of the present disclosure, the distance D1 may be a distance from a center of the via 342 to a center of the via 343. In accordance with some embodiments of the present disclosure, the shape of the vias 342, 343 may be square, rectangle or circle.

FIG. 5B illustrates a schematic view of a metal line and a via in accordance with some embodiments of the present disclosure. Referring to FIG. 1 and FIG. 5B, the vias 12 are electrically connected to the metal line 111. In accordance with some embodiments of the present disclosure, the vias 12 may be disposed under the metal line 111.

Figure 6:
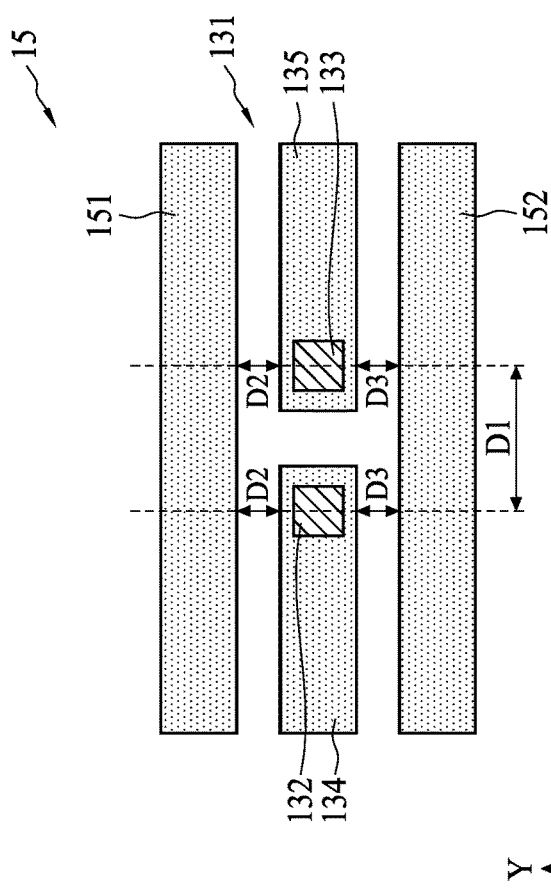
FIG. 6 illustrates a schematic view of a different-net via pair and a 1-dimension section in accordance with some embodiments of the present disclosure.

FIG. 6 illustrates a schematic view of a different-net via pair and a 1-dimension section in accordance with some embodiments of the present disclosure. Referring to FIG. 1 and FIG. 6, the semiconductor structure 10 further includes at least one 1-dimension section 15 disposed around the different-net via pair 131. In accordance with some embodiments of the present disclosure, the 1-dimension section 15 includes at least one upper metal line 151 and at least one lower metal line 152. The upper metal line 151 is disposed on an upper position corresponding to the metal lines 134, 135 of the different-net via pair 131 along a second axis, for example the second axis is Y-axis. Furthermore, a long portion of the upper metal line 151 extends in the first axis (X-axis). The lower metal line 152 is disposed on a lower position corresponding to the metal lines 134, 135 of the different-net via pair 131 along the second axis (Y-axis). And, a long portion of the lower metal line 152 extends in the first axis (X-axis). In accordance with some embodiments of the present disclosure, the transmission gate line region 13 may include 2-8 poly pitches extending in the first direction, and the 1-dimension section disposed within the transmission gate line region. In accordance with some embodiments of the present disclosure, the 1-dimension section 15 may be disposed within a range of ±2 poly pitches from transmission gate line region 13.

In accordance with some embodiments of the present disclosure, a gap D2 between the metal line 134 and the upper metal line 151 is about 1-1.5 metal space in the wafer. In accordance with some embodiments of the present disclosure, a gap D3 between the metal line 134 and the lower metal line 152 is about 1-1.5 metal space in the wafer. In accordance with some embodiments of the present disclosure, the metal space may be a minimum value between two metal lines in the wafer.

Figure 7:
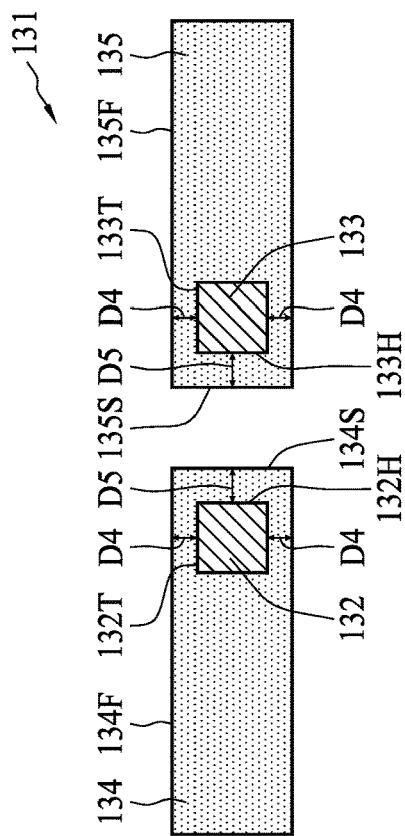
FIG. 7 illustrates a schematic view of a different-net via pair in accordance with some embodiments of the present disclosure.

FIG. 7 illustrates a schematic view of a different-net via pair in accordance with some embodiments of the present disclosure. Referring to FIG. 7, the metal line 134 of the different-net via pair 131 includes a first side 134F and a second sides 134S, and the metal line 135 of the different-net via pair 131 includes a first side 135F and a second sides 135S. The via 132 of the different-net via pair 131 includes a third side 132T and a fourth side 132H, and the via 133 of the different-net via pair 131 includes a third side 133T and a fourth side 133H. The via 132 includes a first width, in accordance with some embodiments of the present disclosure the first width may be a minimum value for the width of the via 132. For the via 132 and the metal line 134, the third side 132T is corresponding to the first side 134F, and a distance D4 between the third side 132T and the first side 134F is about 0-0.2 the first width. For the via 133 and the metal line 135, the third side 133T is corresponding to the first side 135F, and a distance D4 between the third side 133T and the first side 135F is about 0-0.2 the first width. For the via 132 and the metal line 134, the fourth side 132H is corresponding to the second side 134S, and a distance D5 between the fourth side 132H and the second side 134S is about 0.3-0.8 the first width. For the via 133 and the metal line 135, the fourth side 133H is corresponding to the second side 135S, and a distance D5 between the fourth side 133H and the second side 135S is about 0.3-0.8 the first width.

Figure 8:
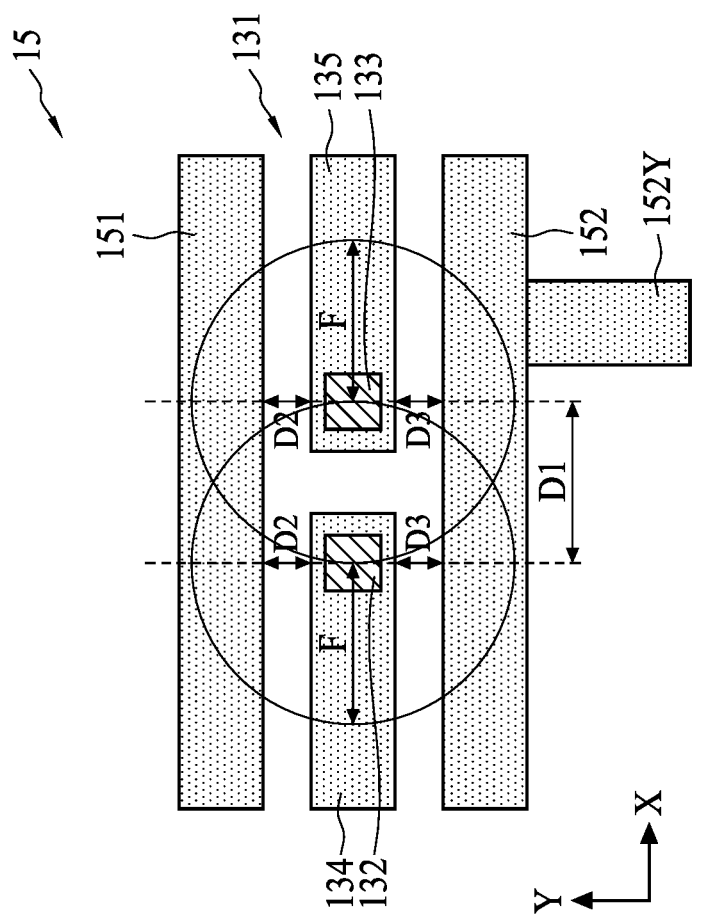
FIG. 8 illustrates a schematic view of a different-net via pair and a 1-dimension section in accordance with some embodiments of the present disclosure.

FIG. 8 illustrates a schematic view of a different-net via pair and a 1-dimension section in accordance with some embodiments of the present disclosure. Referring to FIG. 6 and FIG. 8, for the different-net via pair 131 and the 1-dimension section 15, the long portion of the upper metal line 151 touches a circle drawing with a center of the via 132 and with a radius (F) of the distance between two vias 132, 133, and the long portion of the upper metal line 151 extends in the first axis (X-axis). The long portion of the lower metal line 152 touches a circle drawing with a center of the via 132 and with a radius (F) of the distance between two vias 132, 133, and the long portion of the lower metal line 152 extends in the first axis (X-axis). In accordance with some embodiments of the present disclosure, the radius (F) may be the same as the distance D1. Furthermore, the lower metal line 152 may include a metal line 152Y extends in the first axis (X-axis).

Figure 9:
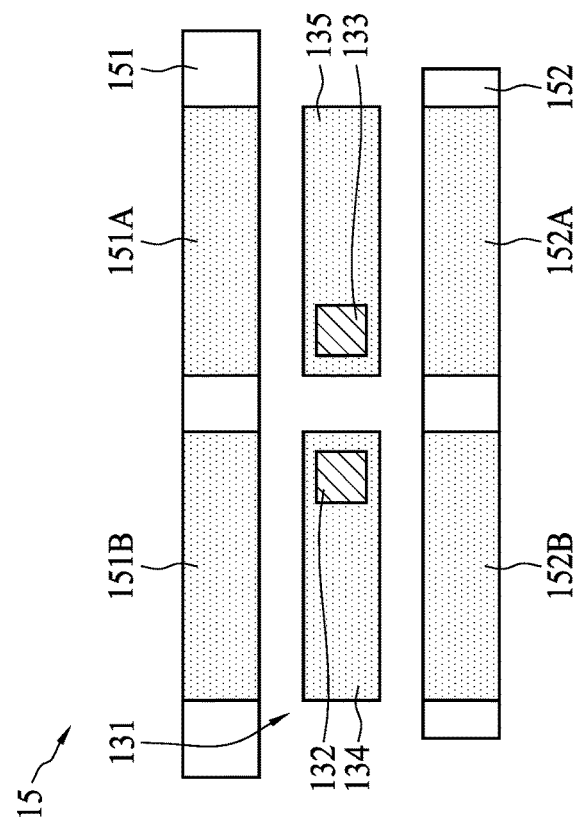
FIG. 9 illustrates a schematic view of a different-net via pair and a 1-dimension section in accordance with some embodiments of the present disclosure.

FIG. 9 illustrates a schematic view of a different-net via pair and a 1-dimension section in accordance with some embodiments of the present disclosure. Referring to FIG. 9, for the upper metal line 151 and the metal line 135 of the different-net via pair 131, the long portion of the upper metal line 151 includes an upper parallel part 151A parallel with the metal line 135 of the different-net via pair 131, and a length of the upper parallel part 151A is about 0-1.5 poly pitches. For the upper metal line 151 and the metal line 134 of the different-net via pair 131, the long portion of the upper metal line 151 includes an upper parallel part 151B parallel with the metal line 134 of the different-net via pair 131, and a length of the upper parallel part 151B is about 0-1.5 poly pitches. For the lower metal line 152 and the metal line 135 of the different-net via pair 131, the long portion of the lower metal line 152 includes a lower parallel part 152A parallel with the metal line 135 of the different-net via pair 131, and a length of the lower parallel part 152A is about 0-1.5 poly pitches. For the lower metal line 152 and the metal line 134 of the different-net via pair 131, the long portion of the lower metal line 152 includes a lower parallel part 152B parallel with the metal line 134 of the different-net via pair 131, and a length of the lower parallel part 152B is about 0-1.5 poly pitches.

Figure 10:
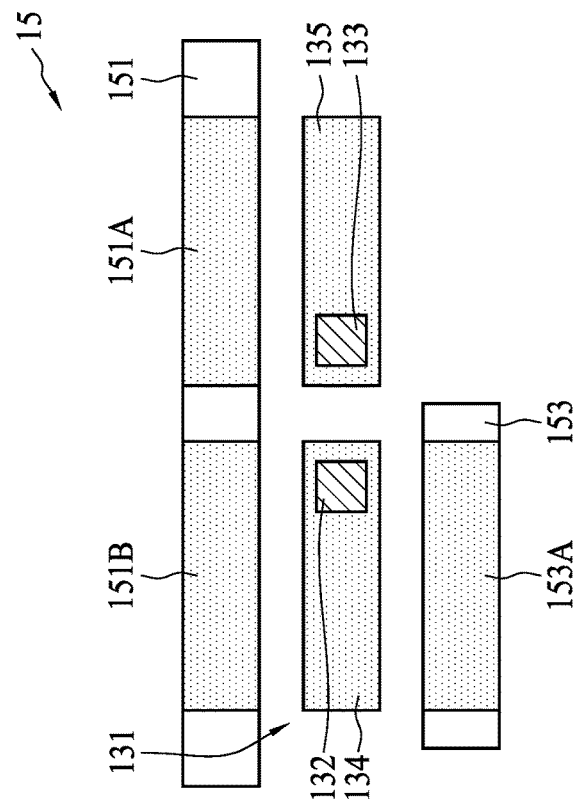
FIG. 10 illustrates a schematic view of a different-net via pair and a 1-dimension section in accordance with some embodiments of the present disclosure.

FIG. 10 illustrates a schematic view of a different-net via pair and a 1-dimension section in accordance with some embodiments of the present disclosure. Referring to FIG. 10, the 1-dimension section 15 includes an upper metal line 151 and a lower metal line 153. The lower metal line 153 only includes a lower parallel part 153A parallel with the metal line 134 of the different-net via pair 131.

Figure 11:
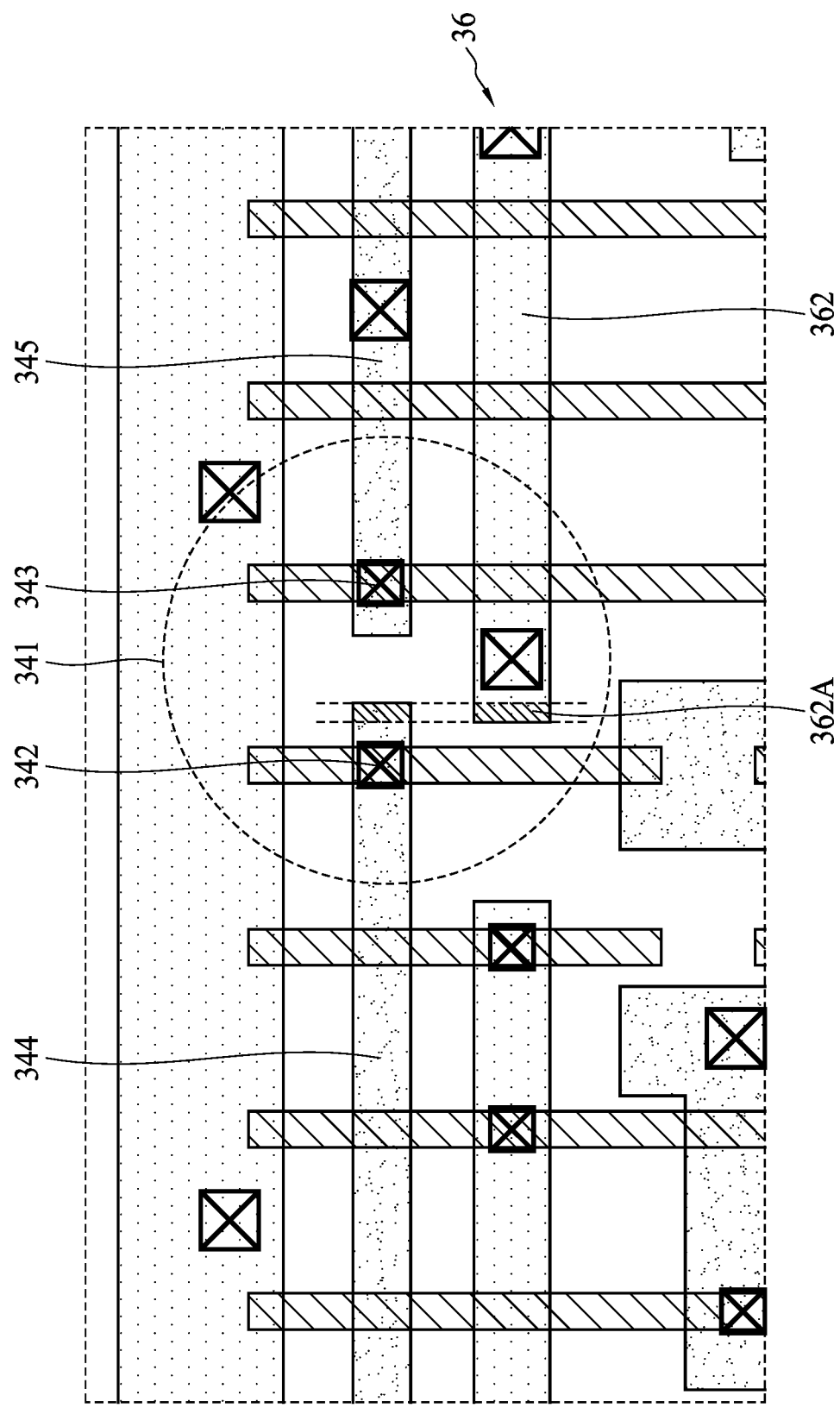
FIG. 11 illustrates an enlarged layout view of a semiconductor structure in accordance with some embodiments of the present disclosure.

FIG. 11 illustrates an enlarged layout view of a semiconductor structure in accordance with some embodiments of the present disclosure. Referring to FIG. 3 and FIG. 11, the different-net via pair 341 has two vias 342, 343 and two metal lines 344, 345. A lower metal line 362 includes a lower parallel part 362A parallel with the metal line 344 of the different-net via pair 341, and a length of the lower parallel part 362A is about 0-1.5 poly pitches. In accordance with some embodiments of the present disclosure, the lower parallel part 362A is short.

Figure 12:
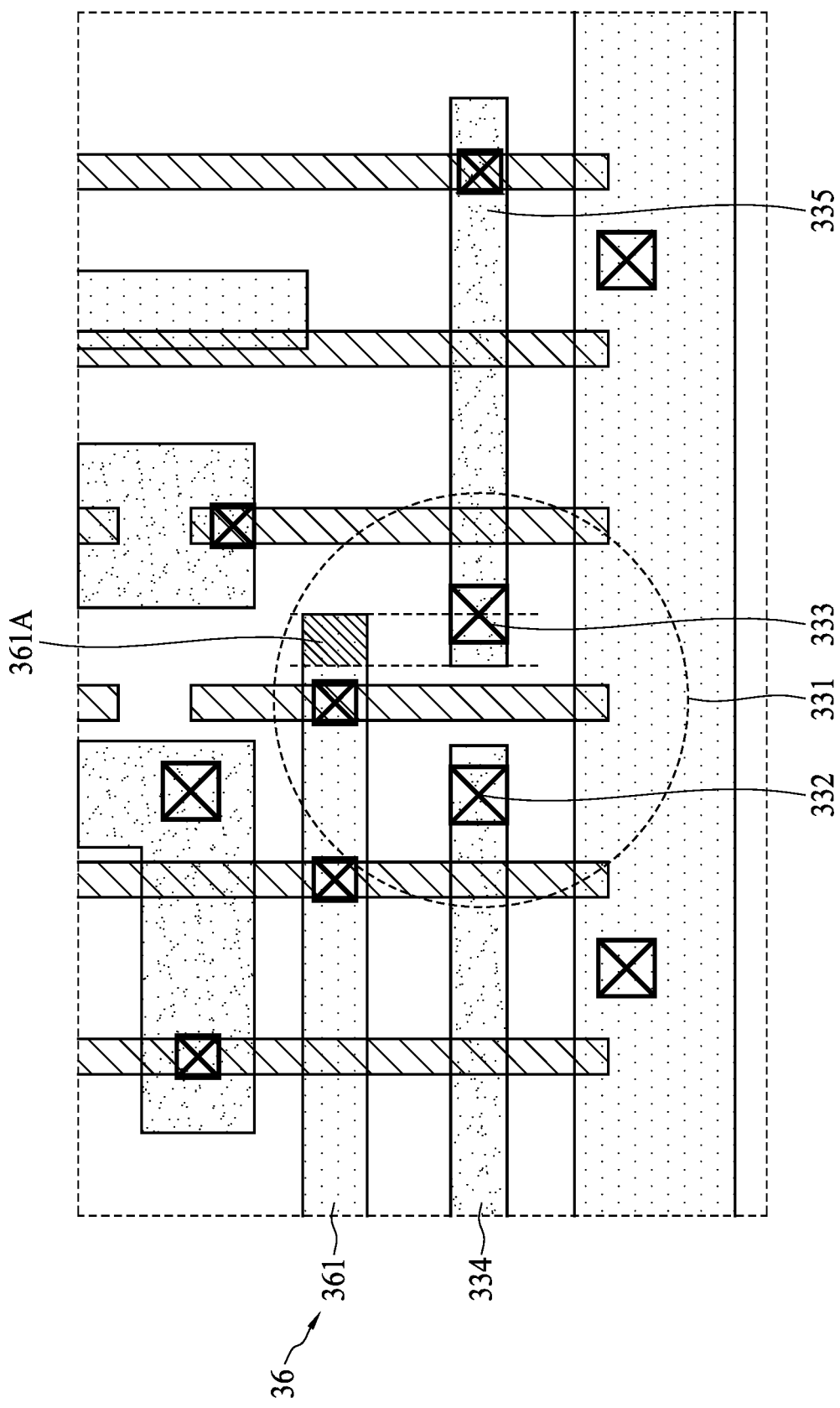
FIG. 12 illustrates an enlarged layout view of a semiconductor structure in accordance with some embodiments of the present disclosure.

FIG. 12 illustrates an enlarged layout view of a semiconductor structure in accordance with some embodiments of the present disclosure. Referring to FIG. 3 and FIG. 12, the different-net via pair 331 has two vias 332, 333 and two metal lines 334, 335. An upper metal line 361 includes an upper parallel part 361A parallel with the metal line 335 of the different-net via pair 331, and a length of the lower parallel part 361A is about 0-1.5 poly pitches. In accordance with some embodiments of the present disclosure, the upper parallel part 361A is short.

Figure 13:
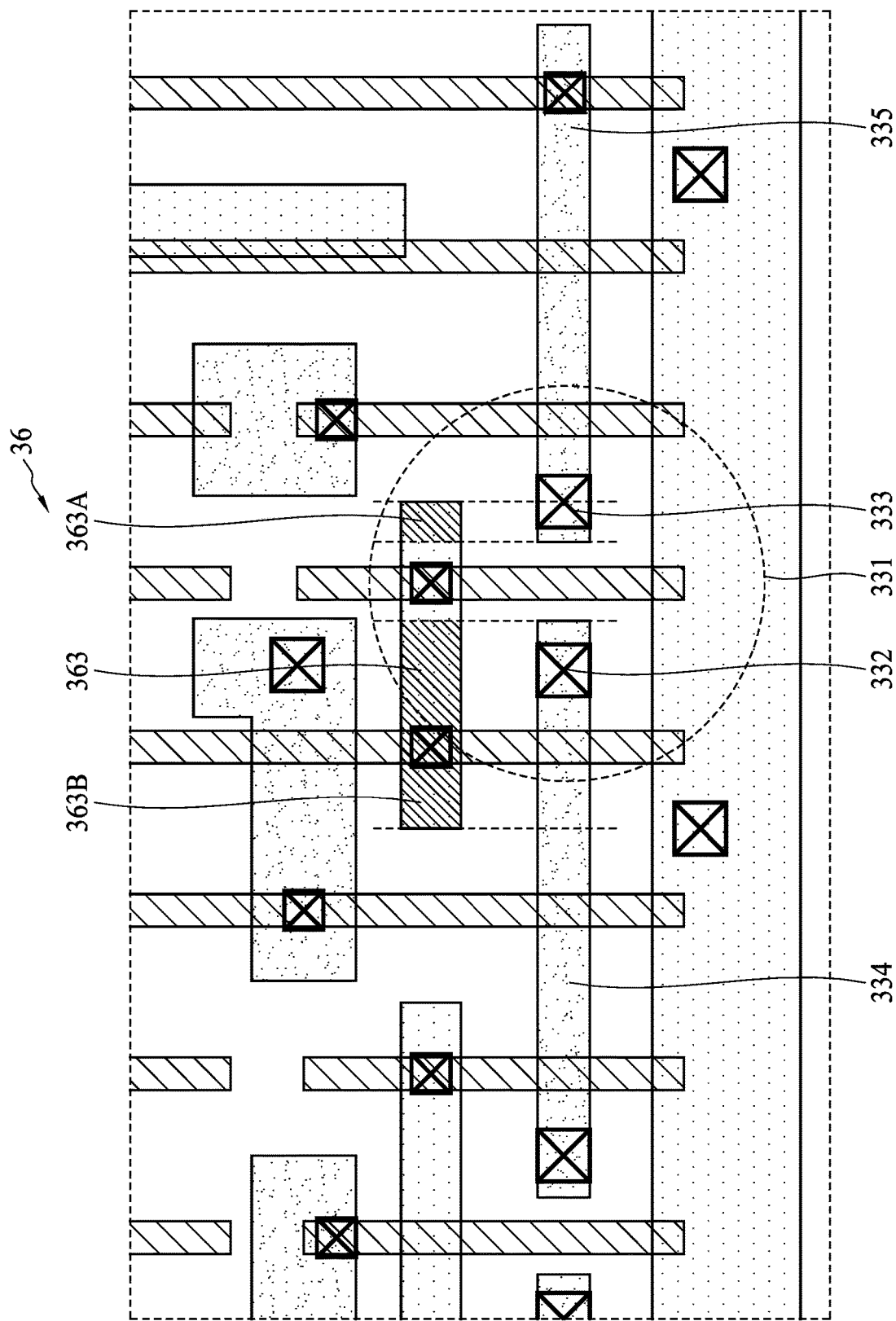
FIG. 13 illustrates an enlarged layout view of a semiconductor structure in accordance with some embodiments of the present disclosure.

FIG. 13 illustrates an enlarged layout view of a semiconductor structure in accordance with some embodiments of the present disclosure. Referring to FIG. 3 and FIG. 13, an upper metal line 363 includes two upper parallel parts 363A, 363B. The upper parallel parts 363A is parallel with the metal line 335 of the different-net via pair 331, and a length of the upper parallel part 363A is about 0-1.5 poly pitches. In accordance with some embodiments of the present disclosure, the upper parallel part 363A is short. The upper parallel parts 363B is parallel with the metal line 334 of the different-net via pair 331, and a length of the upper parallel part 363B is about 0-1.5 poly pitches. In accordance with some embodiments of the present disclosure, the upper parallel part 363B is short.

Figure 14:
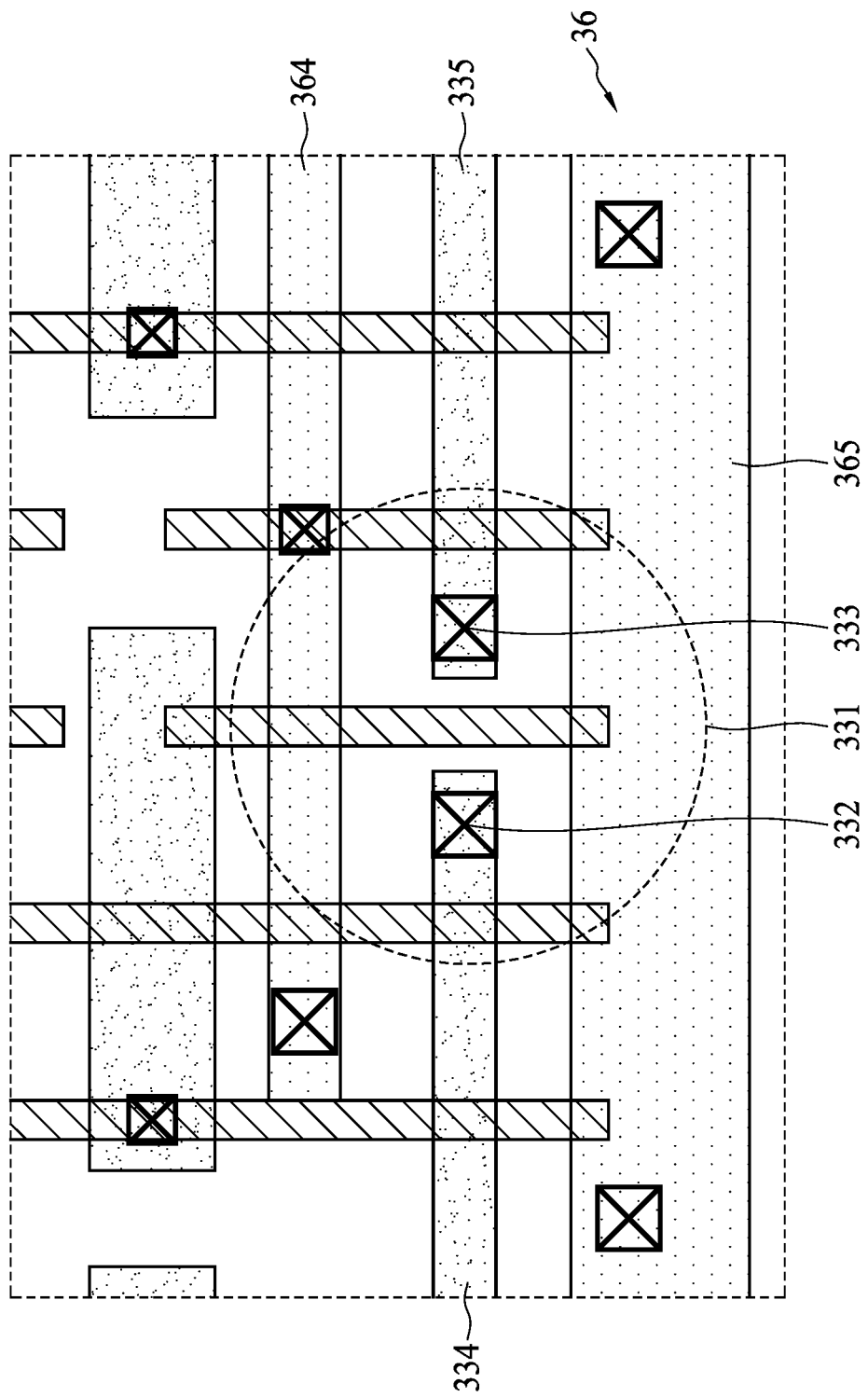
FIG. 14 illustrates an enlarged layout view of a semiconductor structure in accordance with some embodiments of the present disclosure.

FIG. 14 illustrates an enlarged layout view of a semiconductor structure in accordance with some embodiments of the present disclosure. Referring to FIG. 3 and FIG. 14, the different-net via pair 331 has two vias 332, 333 and two metal lines 334, 335. An upper metal line 364 includes a first thickness along the second axis, and a lower metal line 365 includes a second thickness along the second axis. In accordance with some embodiments of the present disclosure, the first thickness of the upper metal line 364 is different from the second thickness of the lower metal line 365, and the first thickness of the upper metal line 364 is smaller than the second thickness of the lower metal line 365. In accordance with some embodiments of the present disclosure, the lower metal line 365 may be a grounded power line.

Figure 15:
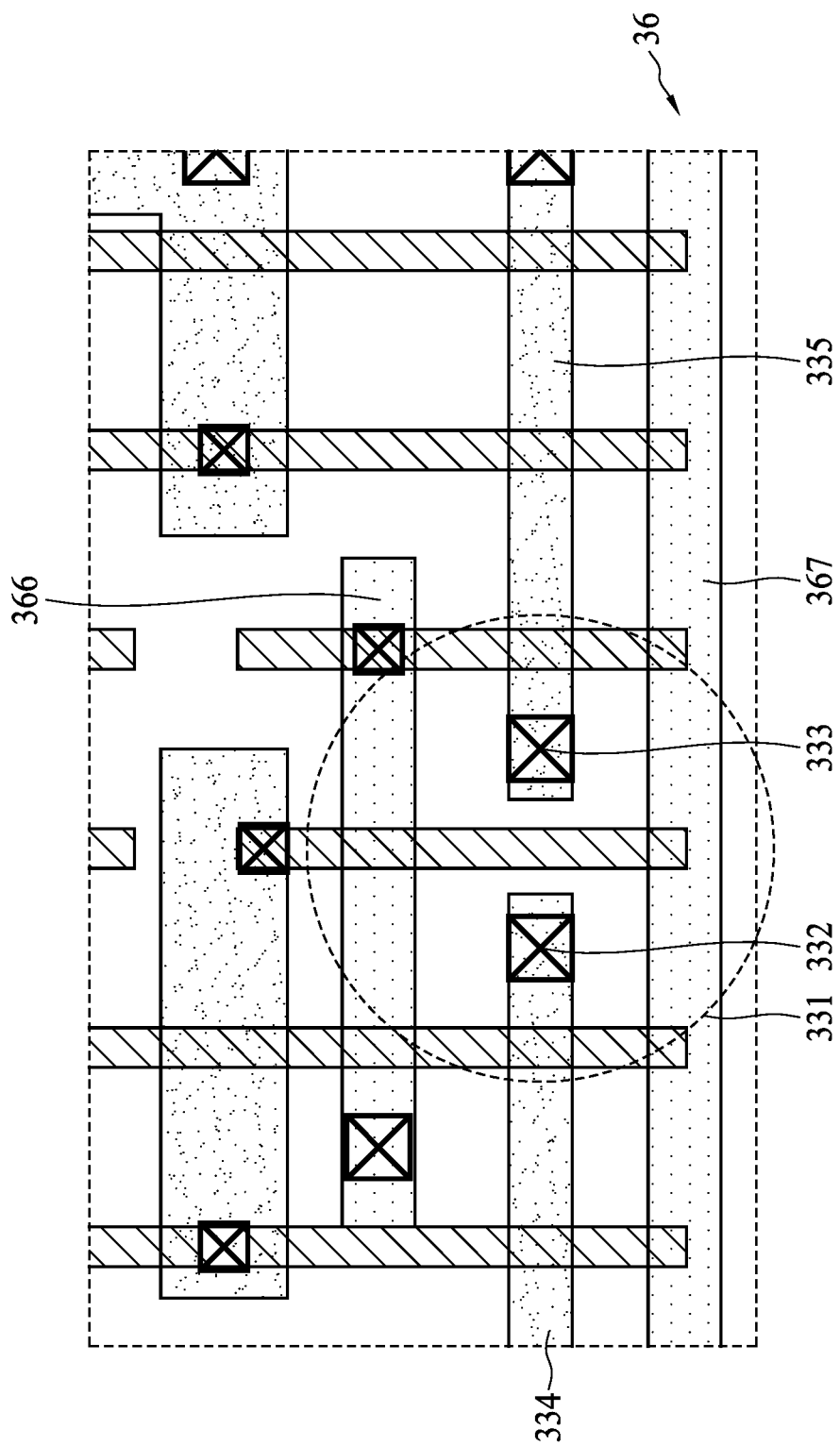
FIG. 15 illustrates an enlarged layout view of a semiconductor structure in accordance with some embodiments of the present disclosure.

FIG. 15 illustrates an enlarged layout view of a semiconductor structure in accordance with some embodiments of the present disclosure. Referring to FIG. 3 and FIG. 15, the different-net via pair 331 has two vias 332, 333 and two metal lines 334, 335. An upper metal line 366 includes a first thickness along the second axis, and a lower metal line 367 includes a second thickness along the second axis. In accordance with some embodiments of the present disclosure, the first thickness of the upper metal line 366 is the same as the second thickness of the lower metal line 367.

Figure 16:
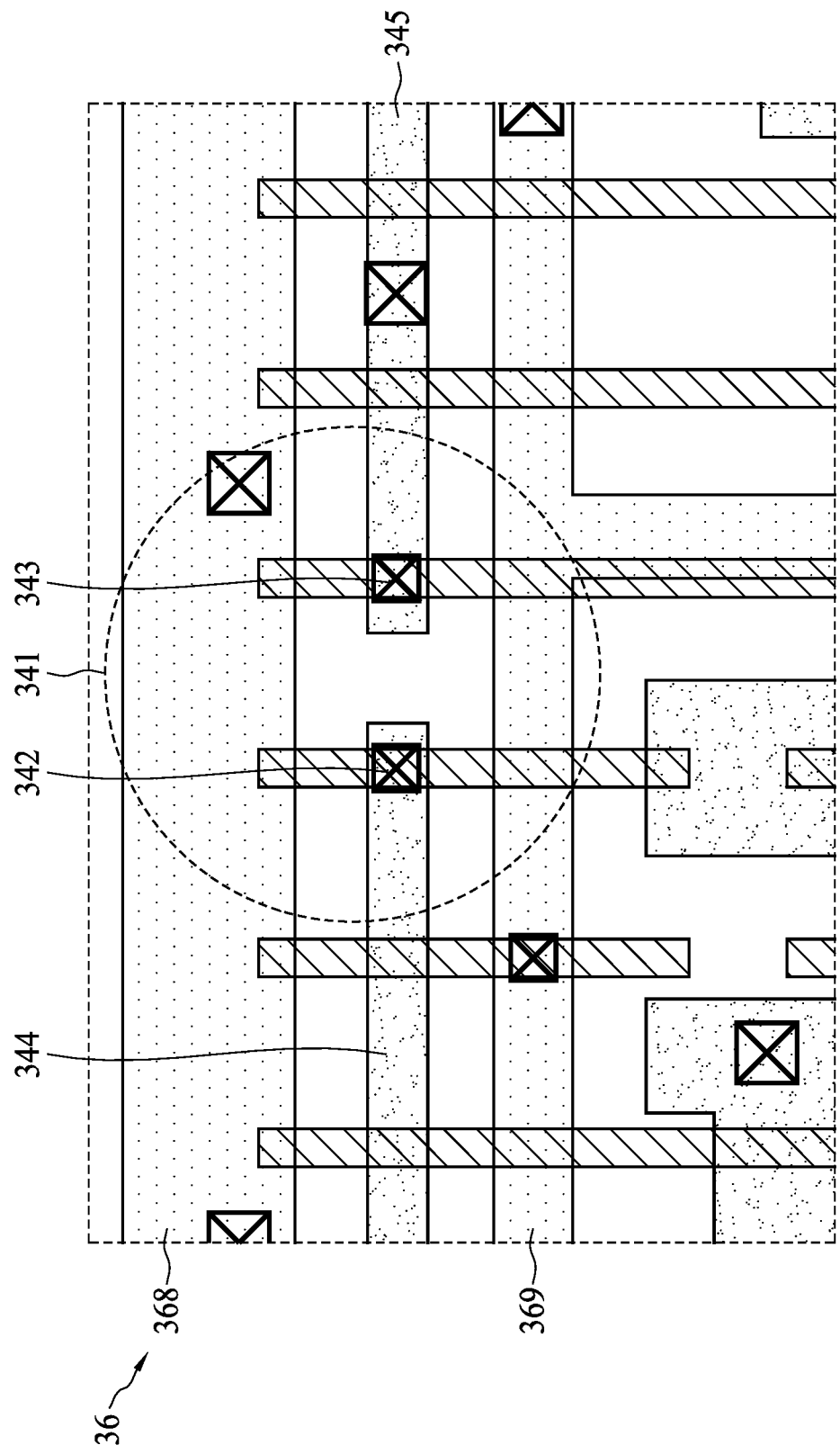
FIG. 16 illustrates an enlarged layout view of a semiconductor structure in accordance with some embodiments of the present disclosure.

FIG. 16 illustrates an enlarged layout view of a semiconductor structure in accordance with some embodiments of the present disclosure. Referring to FIG. 3 and FIG. 16, the different-net via pair 341 has two vias 342, 343 and two metal lines 344, 345. An upper metal line 368 includes a first thickness along the second axis, and a lower metal line 369 includes a second thickness along the second axis. In accordance with some embodiments of the present disclosure, the first thickness of the upper metal line 368 is different from the second thickness of the lower metal line 369, and the first thickness of the upper metal line 368 is larger than the second thickness of the lower metal line 369. In accordance with some embodiments of the present disclosure, the upper metal line 368 may be a power line.

Figure 17:
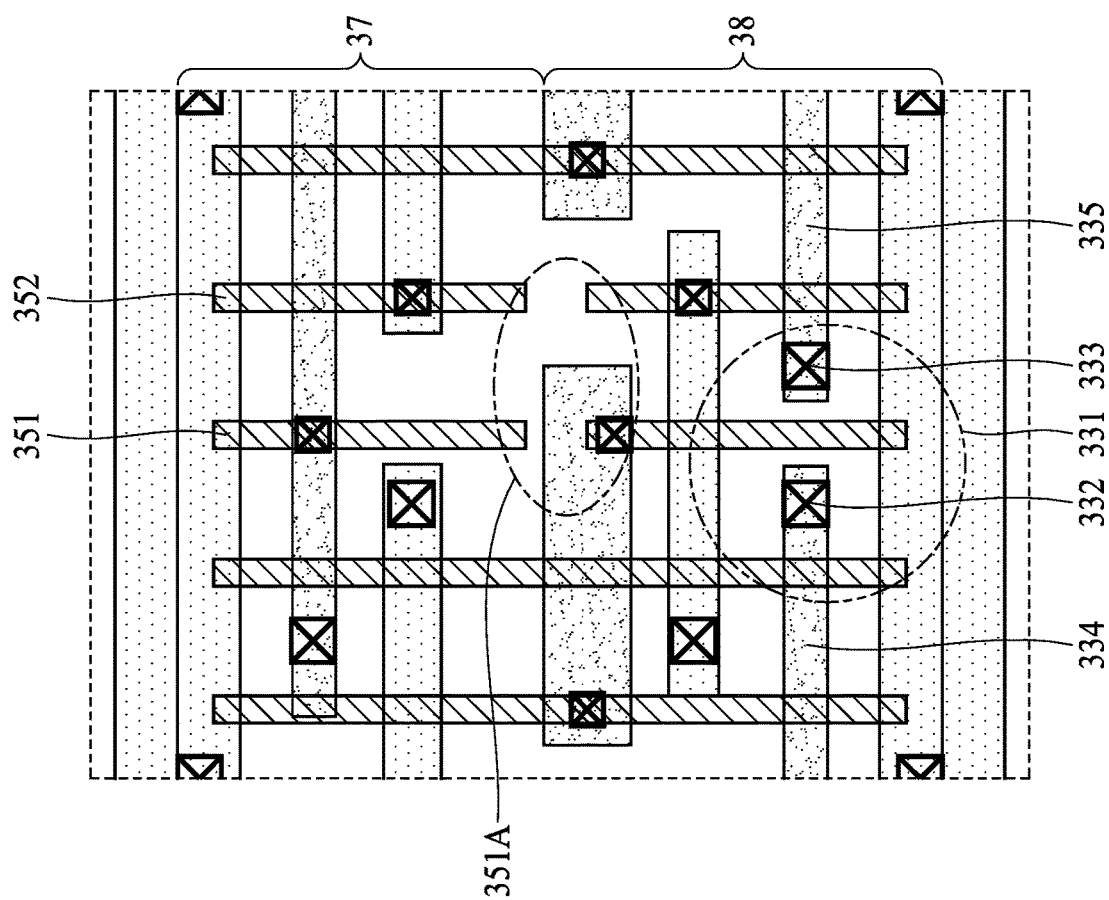
FIG. 17 illustrates an enlarged layout view of a semiconductor structure in accordance with some embodiments of the present disclosure.

FIG. 17 illustrates an enlarged layout view of a semiconductor structure in accordance with some embodiments of the present disclosure. Referring to FIG. 17, the different-net via pair 331 has two vias 332, 333 and two metal lines 334, 335. The two vias 332, 333 are disposed aside the disconnected poly strap 351, and connected to active areas. The two vias 332, 333 may be source/drain vias. In accordance with some embodiments of the present disclosure, the disconnected poly strap 351 includes a separated portion 351A configured on an adjacent area of a first doping region 37 and a second doping region 38. In accordance with some embodiments of the present disclosure, the first doping region 37 may include P-type dopant, and the second doping region 38 may include N-type dopant. In accordance with some embodiments of the present disclosure, the disconnected poly line region may include 2-8 poly pitches extending in the first direction, and the 1-dimension section disposed within the disconnected poly line region. In accordance with some embodiments of the present disclosure, the 1-dimension section may be disposed within a range of ±2 poly pitches from the disconnected poly strap 351 or 352.

Figure 18:
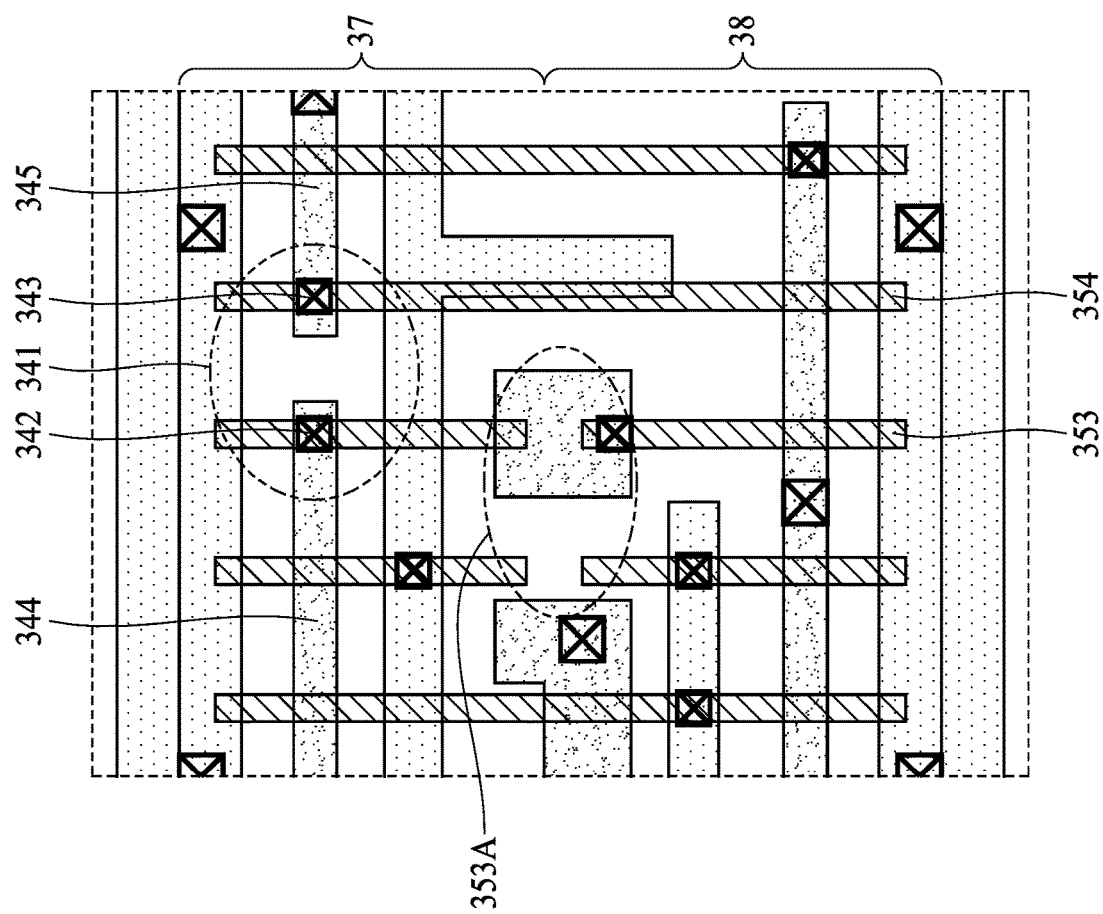
FIG. 18 illustrates an enlarged layout view of a semiconductor structure in accordance with some embodiments of the present disclosure.

FIG. 18 illustrates an enlarged layout view of a semiconductor structure in accordance with some embodiments of the present disclosure. Referring to FIG. 18, the different-net via pair 341 has two vias 342, 343 and two metal lines 344, 345. The via 342 is disposed on the disconnected poly strap 353, and connected to the disconnected poly strap 353. The via 342 may be a gate via. The via 343 is disposed on a neighboring poly strap 354 adjacent to the disconnected poly strap 353, and connected to the neighboring poly strap 354. The via 343 may be a gate via. In accordance with some embodiments of the present disclosure, the neighboring poly strap 354 may be a poly strap or a disconnected poly strap. In accordance with some embodiments of the present disclosure, the disconnected poly strap 353 includes a separated portion 353A configured on an adjacent area of a first doping region 37 and a second doping region 38. In accordance with some embodiments of the present disclosure, the first doping region 37 may include P-type dopant, and the second doping region 38 may include N-type dopant.

Figure 19:
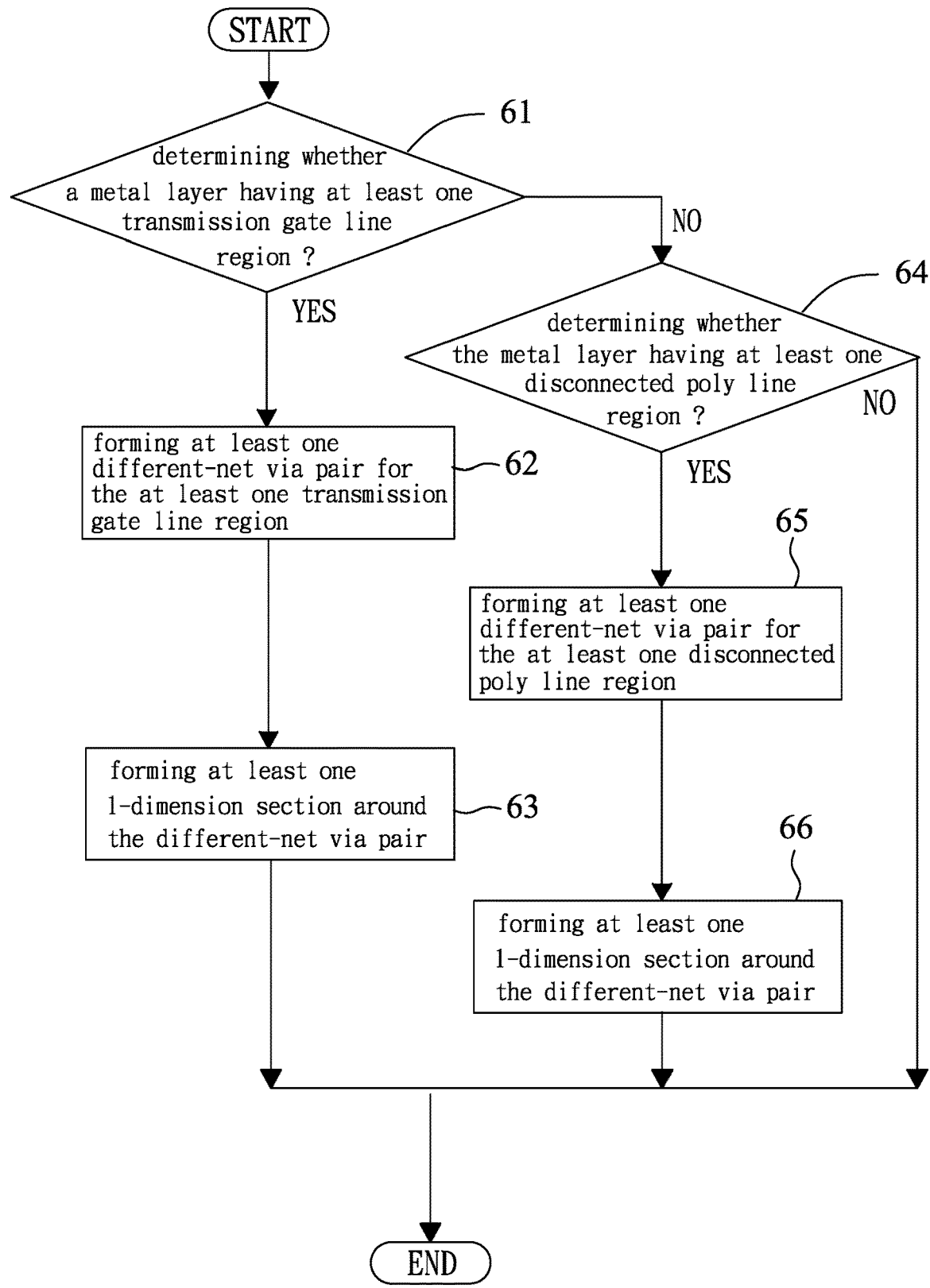
FIG. 19 is a flowchart illustrating a layout method of a semiconductor structure in accordance with some embodiments of the present disclosure.

FIG. 19 is a flowchart illustrating a layout method of a semiconductor structure in accordance with some embodiments of the present disclosure. Referring to FIG. 1 and FIG. 19, in operation 61, a step is determined whether a metal layer 11 having at least one transmission gate line region 13. The metal layer 11 has a plurality of metal lines 111, and the metal lines 111 are connected to vias 12 on a semiconductor substrate. The at least one transmission gate line region 13 is connected to at least one transmission gate corresponding to at least one transmission gate circuit. In accordance with some embodiments of the present disclosure, the layout of the metal layer 11 may be transferred to a file, and the circuit for the metal layer 11 may be transferred to another file. Thus, the transmission gate line region 13 may be determined by comparing the file from the metal layer 11 with another file from the circuit.

In operation 62, at least one different-net via pair 131 is formed for the at least one transmission gate line region 13. The different-net via pair 131 has two vias 132, 133 and two metal lines 134, 135. The two metal lines 134, 135 respectively are connected to different net and extending in the first axis (X-axis). A distance between the two vias 132, 133 of the different-net via pair may be within about 1.5 poly pitch. The distance may be between about 0.8-1.5 poly pitch.

In accordance with some embodiments of the present disclosure, at least one via and at least one metal line are adjusted to form the different-net via pair. Referring to FIG. 1 and FIG. 2, the via 212c in FIG. 2 may be moved adjacent to the via 212a to be the via 133 as shown in FIG. 1, and the metal line 211b in FIG. 2 is adjusted to extend in the first direction, and the other portion of the metal line 211b is cut to be the metal line 135 as shown in FIG. 1. Furthermore, the via 212a in FIG. 2 may be the via 132 in FIG. 1, and the metal line 211a in FIG. 2 may be the metal line 135 in FIG. 1. Therefore, the transmission gate line region 23 in FIG. 2 may be adjusted to be the transmission gate line region 13 having the different-net via pair 131.

In operation 63, at least one 1-dimension section is formed around the different-net via pair. Referring to FIG. 6 to FIG. 10, at least one 1-dimension section 15 is formed around the different-net via pair 131. The 1-dimension section 15 may include at least one upper metal line 151 and at least one lower metal line 152, and the detailed description of the 1-dimension section 15 is illustrated in the above and is omitted here for brevity.

Referring to FIG. 3 and FIG. 19, in operation 64, a step is determined whether the metal layer 31 having at least one disconnected poly line region 33. Referring to operation 61 and operation 64, if there is no transmission gate line region, the layout method of the semiconductor structure further includes the step of determining whether the metal layer having at least one disconnected poly line region. The at least one disconnected poly line region 33 is corresponding to at least one disconnected poly strap 351. The metal layer 31 has a plurality of metal lines 311.

In operation 65, at least one different-net via pair 331 is formed for the at least one disconnected poly line region 33. The different-net via pair 331 has two vias 332, 333 and two metal lines 334, 335. The two metal lines 334, 335 respectively are connected to different net and extending in the first axis (X-axis). A distance between the two vias 332, 333 of the different-net via pair 331 may be within about 1.5 poly pitch. The distance may be between about 0.8-1.5 poly pitch.

In accordance with some embodiments of the present disclosure, at least one via and at least one metal line are adjusted to form the different-net via pair. Referring to FIG. 3 and FIG. 4, the via 412c in FIG. 4 may be moved adjacent to the via 412a to be the via 333 as shown in FIG. 3, and the metal line 411b in FIG. 4 is adjusted to extend in the first axis (X-axis), and the other portion of the metal line 411b is cut to be the metal line 335 as shown in FIG. 3. Furthermore, the via 412a in FIG. 4 may be the via 332 in FIG. 3, and the metal line 411a in FIG. 4 may be the metal line 335 in FIG. 3. Therefore, the disconnected poly line region 43 in FIG. 4 may be adjusted to be the disconnected poly line region 33 having the different-net via pair 331.

In operation 66, at least one 1-dimension section is formed around the different-net via pair. Referring to FIG. 11 to FIG. 16, at least one 1-dimension section 36 is formed around the different-net via pair 331 or 341. The detailed description of the 1-dimension section 36 is illustrated in the above and is omitted here for brevity.

Referring to FIG. 17, the layout method of the semiconductor structure further includes a step of disposing the two vias 332, 333 aside the disconnected poly strap 351 and connected to active areas. Referring to FIG. 18, the layout method of the semiconductor structure further includes a step of disposing the via 342 on the disconnected poly strap 353, and connected to the disconnected poly strap 353, and disposing the other via 343 on a neighboring poly strap 354 adjacent to the disconnected poly strap 353, and connected to the neighboring poly strap 354.

In some embodiments, a semiconductor structure is disclosed, including: a plurality of vias and a metal layer. The vias are disposed on a semiconductor substrate. The metal layer has a plurality of metal lines and at least one transmission gate line region. The metal lines are connected to the vias. The at least one transmission gate line region is connected to at least one transmission gate corresponding to at least one transmission gate circuit. The transmission gate line region includes at least one different-net via pair. The different-net via pair has two metal lines and each of the two metal lines is connected to a via respectively. The two metal lines extend along a first axis but toward opposite directions. A distance between the two vias of the different-net via pair is within about 1.5 poly pitch.

In some embodiments, a semiconductor structure is disclosed, including: a plurality of vias and a metal layer. The vias are disposed on a semiconductor substrate. The metal layer has a plurality of metal lines and at least one disconnected poly line region. The metal lines are connected to the vias. The at least one disconnected poly line region is corresponding to at least one disconnected poly strap. The disconnected poly line region includes at least one different-net via pair. The different-net via pair has two metal lines and each of the two metal lines is connected to a via respectively. The two metal lines extend along a first axis but toward opposite directions. A distance between the two vias of the different-net via pair within about 1.5 poly pitch.

In some embodiments, a layout method of a semiconductor structure is disclosed, including: determining whether a metal layer having at least one transmission gate line region, the metal layer having a plurality of metal lines, the metal lines connected to vias on a semiconductor substrate, the at least one transmission gate line region connected to at least one transmission gate corresponding to at least one transmission gate circuit; and forming at least one different-net via pair for the at least one transmission gate line region, the different-net via pair having two metal lines and each of the two metal lines connected to a via respectively, the two metal lines extending along a first axis but toward opposite directions, a distance between the two vias of the different-net via pair within about 1.5 poly pitch.

What is claimed is:

1. A semiconductor structure, comprising:
a plurality of vias on a semiconductor substrate; and
a metal layer, having a plurality of metal lines and at least one transmission gate line region, the metal lines connected to the vias, the at least one transmission gate line region connected to at least one transmission gate corresponding to at least one transmission gate circuit, the transmission gate line region comprising at least one different-net via pair, the different-net via pair having two metal lines and each of the two metal lines connected to a via respectively, the two metal lines extending along a first axis but toward opposite directions, a distance between two vias of the different-net via pair within about 1.5 poly pitch,
wherein the metal layer further comprises at least one 1-dimension section around the different-net via pair, wherein the 1-dimension section comprises at least one upper metal line and at least one lower metal line, wherein the upper metal line is disposed on an upper position corresponding to a metal line of the different-net via pair along a second axis, and a long portion of the upper metal line extends in a first direction,
wherein the lower metal line is disposed on a lower position corresponding to the metal line of the different-net via pair along the second axis, and a long portion of the lower metal line extends in the first direction.

2. The semiconductor structure of claim 1, wherein the distance is between about 0.8-1.5 poly pitch.

3. The semiconductor structure of claim 1, wherein the at least one upper metal line has an upper parallel part parallel with the metal line of the different-net via pair, wherein a length of the upper parallel part is about 0-1.5 poly pitches.

4. The semiconductor structure of claim 3, wherein the at least one lower metal line has a lower parallel part parallel with the metal line of the different-net via pair, wherein a length of the lower parallel part is about 0-1.5 poly pitches.

5. The semiconductor structure of claim 1, wherein the long portion of the upper metal line comprises an upper parallel part parallel with the metal line of the different-net via pair, a length of the upper parallel part is about 0-1.5 poly pitches, and the long portion of the lower metal line comprises a lower parallel part parallel with the metal line of the different-net via pair, a length of the lower parallel part is about 0-1.5 poly pitches.

6. The semiconductor structure of claim 1, wherein the upper metal line comprises a first thickness along the second axis, and the lower metal line comprises a second thickness along the second axis.

7. The semiconductor structure of claim 1, wherein the transmission gate line region comprises 2-8 poly pitches extending in the first direction, and the 1-dimension section disposed within the transmission gate line region.

8. A semiconductor structure, comprising:
a plurality of vias on a semiconductor substrate; and
a metal layer, having a plurality of metal lines and at least one disconnected poly line region, the metal lines connected to the vias, the at least one disconnected poly line region overlapping a disconnected poly strap, the disconnected poly line region comprising at least one different-net via pair, the different-net via pair having two metal lines and each of the two metal lines connected to a via respectively, the two metal lines extending along a first axis but toward opposite directions, a distance between two vias of the different-net via pair within about 1.5 poly pitch.

9. The semiconductor structure of claim 8, wherein the distance is between about 0.8-1.5 poly pitch.

10. The semiconductor structure of claim 8, wherein one of the two vias of the different-net via pair is disposed on the disconnected poly strap and connected to the disconnected poly strap, the other via is disposed on a neighboring poly strap adjacent to the disconnected poly strap and connected to the neighboring poly strap.

11. The semiconductor structure of claim 8, wherein the two vias of the different-net via pair are disposed aside the disconnected poly strap and connected to active areas.

12. The semiconductor structure of claim 8, wherein the metal line of the different-net via pair comprises a first side and a second sides; the via comprises a third side and a fourth side, and the via comprises a first width, the third side is corresponding to the first side, and a distance between the third side and the first side is about 0-0.2 the first width; the fourth side is corresponding to the second side, and a distance between the fourth side and the second side is about 0.3-0.8 the first width.

13. The semiconductor structure of claim 8, wherein the disconnected poly strap comprises a separated portion configured on an adjacent area of a first doping region and a second doping region.

14. The semiconductor structure of claim 8, wherein the disconnected poly line region comprises 2-8 poly pitches extending in the first direction.

15. A layout method of a semiconductor structure, comprising:
determining whether a metal layer has at least one transmission gate line region, the metal layer having a plurality of metal lines, the metal lines connected to vias on a semiconductor substrate, the at least one transmission gate line region connected to at least one transmission gate corresponding to at least one transmission gate circuit;
forming a first different-net via pair for the at least one transmission gate line region, the first different-net via pair having two metal lines and each of the two metal lines connected to a via respectively, the two metal lines extending along a first axis but toward opposite directions, a distance between two vias of the first different-net via pair within about 1.5 poly pitch;
determining whether the metal layer has at least one disconnected poly line region, the at least one disconnected poly line region overlapping at least one disconnected poly strap; and
forming a second different-net via pair for the at least one disconnected poly line region, the second different-net via pair having two metal lines and each of the two metal lines connected to a via respectively, the two metal lines extending along the first axis but toward opposite directions.

16. The layout method of claim 15, further comprising:
forming at least one 1-dimension section around the first different-net via pair.

17. The layout method of claim 15,
wherein a distance between the two vias of the second different-net via pair is within about 1.5 poly pitch.

18. The layout method of claim 15, further comprising:
forming at least one 1-dimension section around the second different-net via pair for the disconnected poly line region.

19. The layout method of claim 15, further comprising:
disposing one of the two vias of the second different-net via pair for the disconnected poly line region on the disconnected poly strap, and connected to the disconnected poly strap; and disposing the other via on a neighboring poly strap adjacent to the disconnected poly strap, and connected to the neighboring poly strap.

20. The layout method of claim 15, further comprising: disposing the two vias aside the disconnected poly strap and connected to active areas.

* * * * *